United States Patent [19]

Brown, Sr. et al.

[11] Patent Number: 4,811,401

[45] Date of Patent: Mar. 7, 1989

[54] SUPERDISTORTED AMPLIFIER CIRCUITRY WITH NORMAL GAIN

[75] Inventors: James W. Brown, Sr.; Jack C. Sondermeyer, both of Meridian, Miss.

[73] Assignee: Peavey Electronics Corporation, Meridian, Miss.

[21] Appl. No.: 207,926

[22] Filed: Jun. 14, 1988

Related U.S. Application Data

[63] Continuation of Ser. No. 63,924, Jun. 19, 1987, abandoned.

[51] Int. Cl.⁴ ............................................. H03G 3/00

[52] U.S. Cl. ....................................... 381/61; 84/1.19

[58] Field of Search ..................... 381/61, 98; 84/1.16, 84/1.19

[56] References Cited

U.S. PATENT DOCUMENTS

| | | |
|---|---|---|
| 3,663,735 | 5/1972 | Evans . |
| 3,860,876 | 1/1975 | Woods . |
| 4,150,253 | 4/1979 | Knoppel ............................. 381/101 |
| 4,290,335 | 9/1981 | Sondermeyer . |
| 4,405,832 | 9/1983 | Sondermeyer ........................ 381/61 |
| 4,479,238 | 10/1984 | Spector . |
| 4,584,700 | 4/1986 | Scholz .................................. 381/61 |

OTHER PUBLICATIONS

Vox Distortion Boaster V8162 (Thomas Organ Co.) 1969.

*Primary Examiner*—Forester W. Isen

*Attorney, Agent, or Firm*—Huff & Associates

[57] ABSTRACT

An amplifier circuit for use with a guitar. It has two modes, a "clean" output mode, and a "super-distortion" mode, which mode has independent gain control prior to a distortion stage. There is also post distortion gain control.

39 Claims, 5 Drawing Sheets

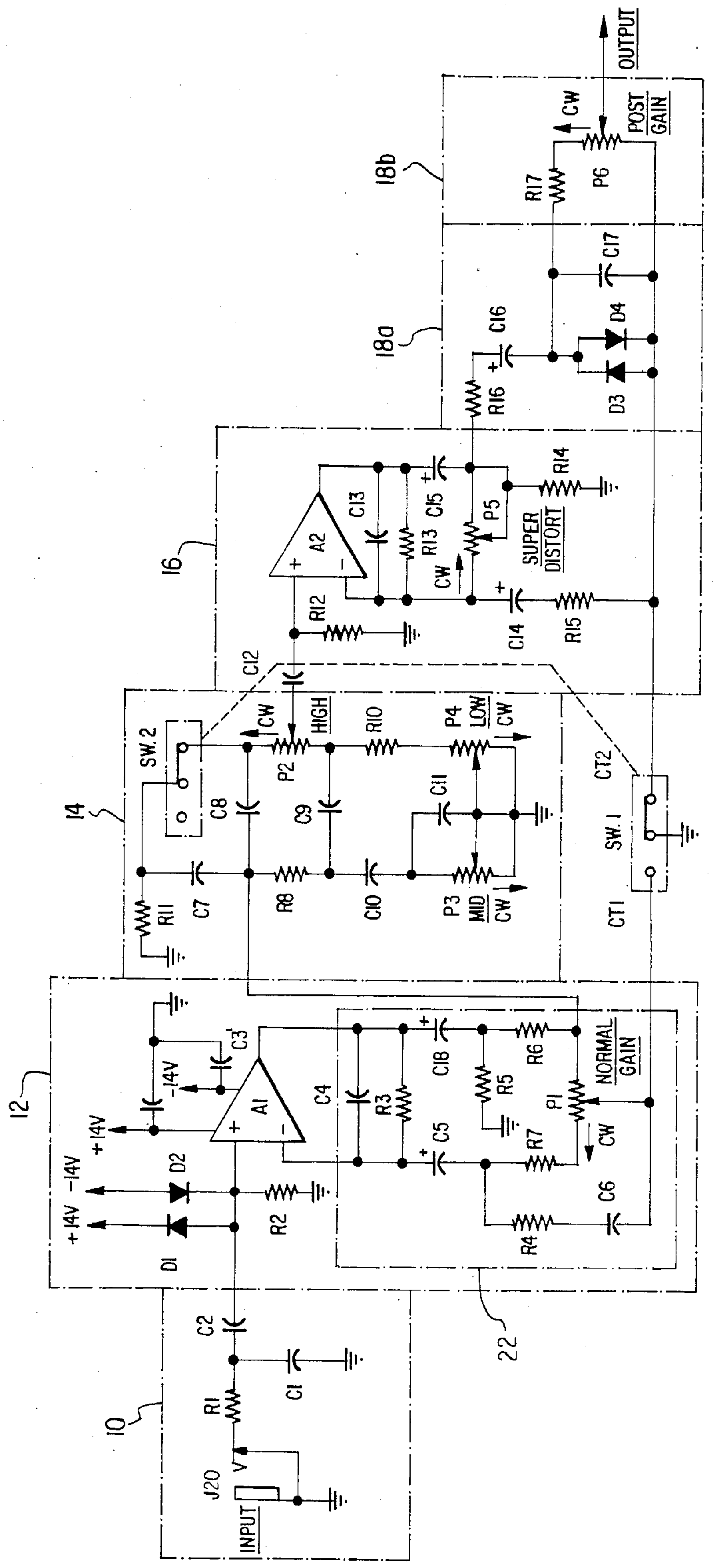
FIG. I

SUPERDISTORTED AMPLIFIER CIRCUITRY WITH NORMAL GAIN

This application is a continuation of application Ser. No. 63,924, filed 06/19/87 and abandoned concurrently with the filing of this application.

BACKGROUND OF THE INVENTION

1. Field of the Invention

This invention is directed to audio amplifier circuitry, and in particular to such circuitry for simulating two-channel audio amplifiers, i.e. audio amplifiers having two alternate channels for signal amplification, but using only a single amplifying channel for providing either selective distortion or non-distorted ("clean" audio output) modes of amplification of audio signals.

2. Background of the Invention

This invention is related to the subject matter disclosed in U.S. Pat. No. 4,405,832, "CIRCUIT FOR DISTORTING AN AUDIO SIGNAL", issued in the name of Jack C. Sondermeyer (a co-inventor of the subject application) on Sept. 20, 1983. The disclosure of that U.S. patent is incorporated herein by reference.

U.S. Pat. No. 4,405,832 discloses distortion generating circuitry including high gain amplification with a variable, controlled feedback network for varying the gain and frequency response thereof. The specific distortion generation is disclosed as a pair of oppositely poled, anti-parallelly-connected diodes, functioning to clip the output signal of an amplifier stage in the single amplifying channel. The feedback network includes a first control means for controlling gain and frequency response of the amplifier associated with the feedback network; and a second control means for mixing the output of the amplifier with the output of the clipping or distortion circuit in variable proportions. The first and second controls are preferably ganged, thereby enabling "tracking" between the amount of gain and the degree of clipping simultaneously with frequency response modification of the amplified output signal to enhance the harmonics of the input signal to the amplifying channel circuitry.

The amplifying circuitry of the aforementioned U.S. patent describes independently operable control switches for switching between normal amplification of audio input signals, whereby a "clean" sound is output, or distortion amplification of the audio input signals, whereby the amplified signals are distorted to enhance the sound of the audio output.

The ganged normal/distortion amplification control of the aforementioned U.S. patent has the disadvantage that it provides relatively broad band gain, as the gain of a pre-amplifier stage is effectively electrically connected constantly regardless of the mode of operation, i.e., normal or distorted output.

SUMMARY OF THE INVENTION

As is evident from the above description, the present invention, while employing the techniques of the distortion control circuitry in U.S. Pat. No. 4,405,832, modifies such techniques at least by the inclusion of additional amplification (gain) prior to the distortion stage where the pre-amplified audio input signal is clipped to generate harmonics. This causes the audio signal in the distortion stage, typically a pair of anti-poled, parallelly-connected diodes, to become operationally "superdistorted", thereby generating additional harmonics which further enhance the sound of the amplified audio signals, and particularly those audio signals within the frequency range produced by guitars.

Additionally, the present inventors have discovered that the provision of additional amplification prior to clipping or distorting the already amplified audio input signal, produces significant enhancement of the "quality" of the output sound, and particularly with application to the amplification of audio frequencies in the range normally associated with guitars. Reference is made to the discussion of the effects of distortion on such audio frequencies under BACKGROUND OF THE INVENTION in U.S. Pat. No. 4,405,832.

Furthermore, the "superdistortion" circuit of the present invention simulates a two-channel audio amplifier circuit by enabling alternate mode selection between normal gain control to produce a "clean" audio output, and "superdistortion" control with commensurate independent amplification control of the variable gain of a superdistortion amplifier stage preceding the distortion stage, and post distortion gain control, to produce a distorted sound output. Thus, when the distortion mode is selected, the operator has the ability to independently vary the amplification of the audio signal to be distorted and the amplification of the audio signals after they have passed the distortion stage.

Furthermore, switching to the normal gain control mode automatically disables the superdistortion amplifier stage, the distortion stage and the post gain control stage, such that amplification of the audio signal in this mode is controlled solely by the gain of the preamplifier stage.

Another feature of the present invention is the employment of tone control for low, middle and high frequencies in both the non-distorted and distorted modes of operation and which includes a switch ganged with the mode control switch such that the mid-frequency range of the preamplified audio input signals are reintroduced with selection of the "superdistortion" mode of operation.

The present invention also is adaptable for operation with other well-known "presence" amplifier stages, brightening circuits and DPDT relay switches for effecting mode control, for example.

In a modified embodiment of the invention, an intermediate amplifier stage is included after a preamplifier stage to enable decreased amplification (gain) of the preamplifier stage, thereby prohibiting clipping of large amplitude audio input signals in the preamplifier stage.

A primary object of the present invention is to provide single channel audio amplification circuitry capable of operating in at least two modes, one mode providing normal gain (clean sound output) and the other mode providing greatly enhanced distorted sound output with commensurate flexibility in normal gain control, post gain control and "superdistortion" gain control.

A further object of the present invention is to provide significant enhancement of the distorted sound produced by clipping amplified audio sound frequencies, and particular those frequencies associated with guitars.

Yet a further object of the present invention is to provide a widely variable gain adjustment of a distortion stage in audio amplification circuitry in conjunction with an independently variable post distortion gain control.

And yet another object of the present invention is to provide tone control of the low, mid-range and high frequencies of the preamplified audio input signals with automatic re-introduction of the mid-range frequencies when in the "superdistortion" control mode of operation.

Yet another object of the invention is to provide all of the objects, features and advantages of the amplification circuitry as disclosed in U.S. Pat. No. 4,405,832, but with much greater flexibility with respect to adjustment of the normal gain, distortion gain and post gain distortion control and with commensurately greater enhancement of the distorted sound output.

BRIEF DESCRIPTION OF THE DRAWINGS

The above objects, features and advantages of the invention are readily apparent from the following description of preferred embodiments of the best mode of carrying out the invention when taken in conjunction with the following drawings, wherein:

FIG. 1 is an exemplary preferred embodiment of a two-amplifier version of the superdistorted amplifier circuitry of the present invention with tone control and using a double-pole-double-throw (DPDT) switch to effect mode conversion control.

DETAILED DESCRIPTION OF THE PREFERRED EMBODIMENTS

The exemplary preferred embodiment of the superdistortion control circuitry of the invention uses a preamplifier stage, the output of which is input to a tone control circuit providing low, mid-range and high frequency control with subsequent amplification of the audio signals such that the amplified audio signals will superdistort the distortion stage, thereby affording greatly enhanced distorted audio sound output from the superdistortion control circuitry.

Figure 6:
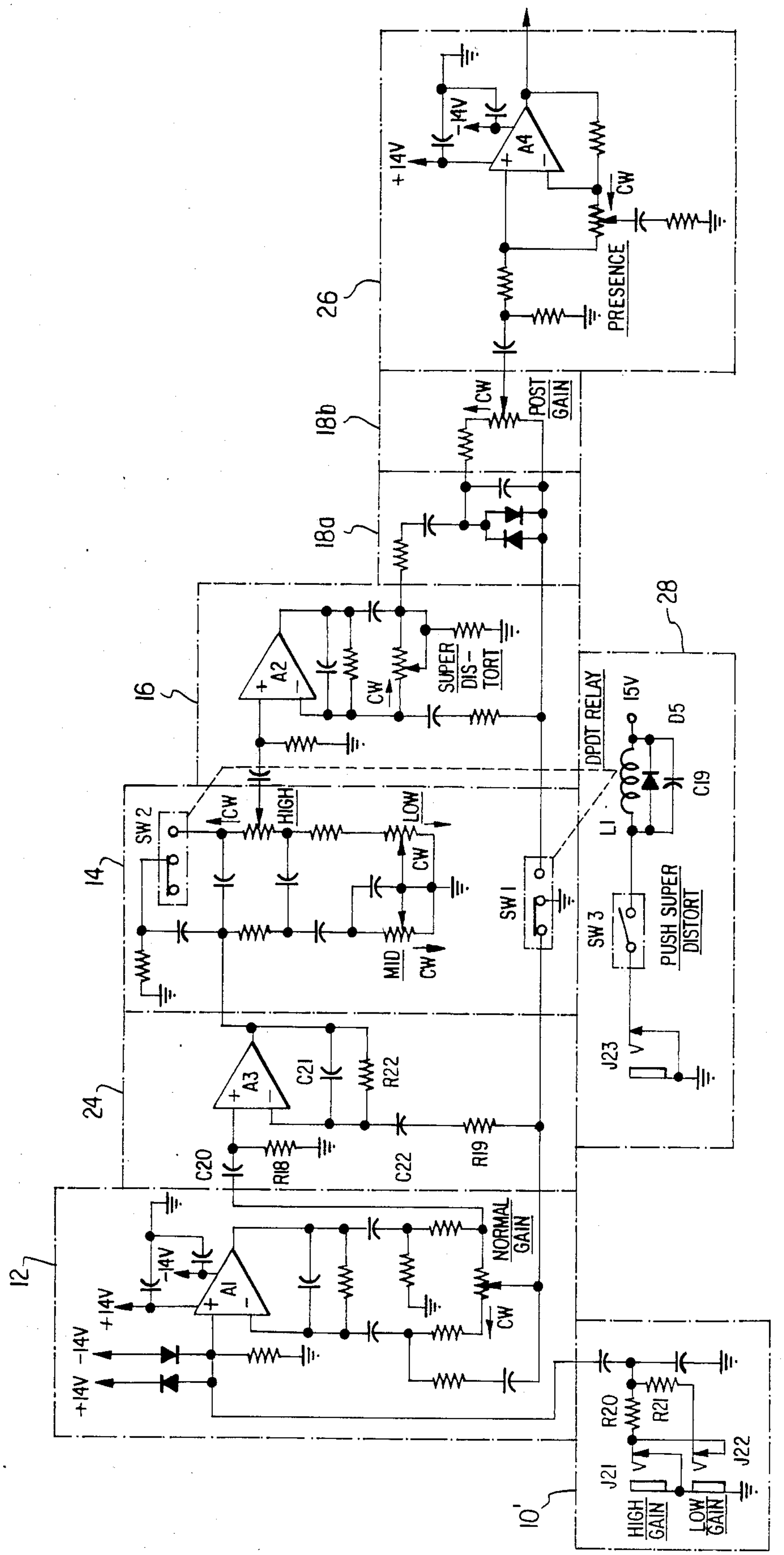
FIG. 6 is a modified embodiment of the superdistorted amplifier circuitry of FIG. 1 with the inclusion of an intermediate amplifier stage, an exemplary peripheral circuit, namely a "presence" circuit; and an external footswitch circuit to effect mode conversion control with the embodiments of FIGS. 1 and 2.

The mode control selection between normal gain and superdistortion is effected by a DPDT switch, although other type switches are employable with the superdistortion control circuitry of the invention as will be more readily apparent from the following description with respect to FIG. 6. For simplification of the following description, the superdistortion amplifier circuitry of FIG. 1 is divided into the following functional components: (1) input stage 10, (2) preamplifier stage 12, (3) tone control filter stage 14, (4) superdistortion gain stage 16, (5) distortion stage **18*a* and (6) output stage 18*b***.

Input stage 10 includes: input jack J20 for electrical connection with a source of audio signals, such as those produced by a guitar; resistor R1 and capacitor C1, forming a very high frequency low pass filter network; and DC isolation capacitor C2.

In preamplifier stage 12, one terminal of diodes D1 and D2 are connected in back-biased relationship to the non-inverting input of amplifier A1 to provide protection for the preamplifier stage from high level audio input signals. Resistor R2 is connected between the non-inverting input of amplifier A1 and ground. Capacitor C3 is connected between the cathode of diode D2 (and the +14 V power supply voltage) and ground to function as a positive by-pass for the +14 V power supply. Capacitor C3' provides the same by-pass function for the −14 V power supply voltage.

Amplifier A1 is a standard broad band operational amplifier of the non-inverting type and powered by plus and minus supply voltages as indicated in FIG. 1. Throughout the following description it is understood that the power supply voltages (and type, i.e. bi-polar or non-bi-polar) shown are only exemplary, as those skilled in the audio amplification art will readily recognize that other power voltage levels as well as non bi-polar power supply types can be used with the superdistortion circuitry of the invention.

Feedback network 22 provides high frequency and low frequency roll-off to essentially shape the frequency response of non-inverting amplifier A1 to a desired characteristic for preamplification of the input signals at input jack J20. Feedback network 22 includes feedback capacitor C4 connected from the output of amplifier A1 to the inverting input thereof, which provides high frequency roll-off for operational amplifier A1. Feedback resistor R3 is parallelly connected across feedback capacitor C4. The terminal of resistor R3 (connected to the inverting input of operational amplifier A1) is connected through DC isolation capacitor C5 to series-connected resistor R4 and capacitor C6, and the other terminal of resistor R3 is connected through DC isolation capacitor C18 to the junction node of resistors R5 and R6. Resistor R7 is connected between the junction node of capacitor C5 and resistor R4 and the CW terminal of normal gain potentiometer P1. The movable tap of potentiometer P1 is connected to C6 and stationary contact CT1 of mode control switch SW1.

The following gain and frequency response is obtained with mode control switch SW1 switched to have movable contact CT2 thereof in contact with the movable tap of potentiometer P1 such that it is short-circuited to ground. The aforementioned position of ganged mode control switch SW1 affords normal or a clean audio output of the superdistortion amplifier circuit shown in FIG. 1. The function of ganged mode control switch SW2 associated with tone control filter circuit 14 is discussed more fully, infra. With the mode control established in the normal mode, as described supra, maximum gain of operational amplifier A1 is obtained with the movable tap of potentiometer P1 at the CW position shown in FIG. 1, and movement of the potentiometer tap CCW causes reduced gain of operational amplifier A1.

In the normal gain control mode, it is convenient to consider the gain of operational amplifier A1 at three settings, namely: (1) minimum, (2) maximum and (3) nominal setting of potentiometer P1, where minimum and maximum setting respectively correspond to the CCW and CW settings of potentiometer P1 as shown in FIG. 1; and the nominal setting conforms to the mid-range setting of potentiometer P1. With the circuit component values as set forth in Table I, the following gains of preamplifier stage 12 are obtained using the well-known equation for the gain of an operational amplifier:

$$A_v=(R3/R+1)\times(P1/(P1+R6)),$$

where R is the effective resistance from the inverting input of operational amplifier A1 to ground.

(1) 0 or -infinity dB;
(2) 55.12 or +35 dB; and
(3) 4.57 or +13 dB

The associated frequency response of operational amplifier A1 is as follows using as a reference the aforementioned nominal setting of normal gain potentiometer P1. The high frequency response is determined as:

$$f=1/(6.28\times R\times C)=1/(6.28\times 33K\times 100\times 10^{-12})=48\text{ kHz }(-3\text{ dB}),$$

where R is the resistance and C the capacitance having the nominal values shown in Table I.

The low frequency response is determined as:

$f=1/(6.28\times R\times C)=1/(6.28\times 5400\times 2.2\times 10^{-6})$ 15 Hz (−3 db), where R is the effective impedance and C is the capacitance of capacitor C5 (all component values as indicated in Table I).

Preamplifier stage 12 is also designed to provide high frequency boost (determined as follows with the aforementioned nominal setting of normal gain potentiometer P1).

$$Av_{(VHF)}=33K/(5K//\ 3.3K)+1=17.5\text{ or }+25\text{ dB}$$

The effective very high frequency boost is then determined as 25 dB−3 dB (the gain computed, supra, with normal gain potentiometer P1 at its nominal gain setting), or +12 dB.

All of the above gains and frequency roll-off values have been determined from the component values of FIG. 1 as listed in Table I at the end of the specification.

It is a significant feature of the invention that, in the superdistortion mode of operation with ganged switch SW1 connected as shown in FIG. 1, the gain of preamplifier stage 12 is essentially "unity" (0 dB), as operational amplifier A1, feedback network 22, and normal gain control potentiometer P1 are "floating". Therefore, the gain of preamplifier stage 12 in the superdistortion mode of operation is independent of the setting of normal gain potentiometer P1, unlike the gain of the preamplifier stage (operational amplifier 10) as shown in FIG. 1 of U.S. Pat. No. 4,405,832.

The output from preamplifier stage 12 is taken from the node junction between resistor R6 and normal gain potentiometer P1 and input to tone control filter stage 14 at the node junction of capacitor C7, C8 and resistor R8. Tone control filter stage 14 is illustrated in FIG. 1 as comprising passive low, mid-range, and high frequency filters, respectively. However, those skilled in the audio amplifier art will recognize that active filters could also be used in place of passive filters. Capacitor C8 and potentiometer P2 form a high-pass frequency filter; capacitor C9, resistor R10 and potentiometer P4 form a low pass frequency filter; and capacitors C10, C11 and potentiometer P3 form a mid-range frequency filter. The low, mid-range and high frequency filters of tone control filter stage 14 have respective center frequencies of 100 Hz, 250 Hz and 5 kHz (with the nominal component values shown in Table I). The design of tone control filter stage 14 is well-known to those skilled in the audio amplifier art. However, the use of such a three-frequency range filter is of particular significance with application of the superdistortion amplifier circuitry of the present invention to the amplification of audio signals produced by guitars.

With continuing reference to FIG. 1, and with ganged mode control switch SW2 in the position for "normal" gain mode control, resistor R11 and capacitor C7 are not electrically connected in the tone control filter circuit 14. However, with ganged switches SW1 and SW2 switched to the position shown in FIG. 1, such that the superdistortion amplifier circuit is set in the superdistortion mode, the common node between capacitor C7 and resistor R11 is electrically connected to the CW terminal of potentiometer P2. This places capacitor C7 in parallel with capacitor C8 of hi-pass filter in tone control filter stage 14 to effectively destroy the mid-frequency notch of the tone filters therein, thereby emphasizing the mid-range frequencies with the superdistortion amplifier circuit of FIG. 1 connected in the superdistortion mode of operation (switches SW1 and SW2 connected as illustrated therein).

Figure 2A:
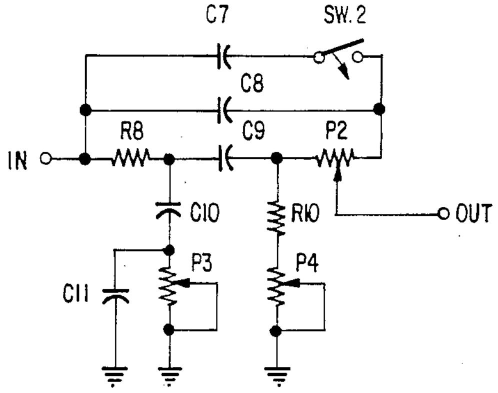
FIG. 2*a* represents an exemplary bridged-T tone control circuit forming a portion of the tone filter control circuit having application with the circuit of FIG. 1.
Figure 2B:
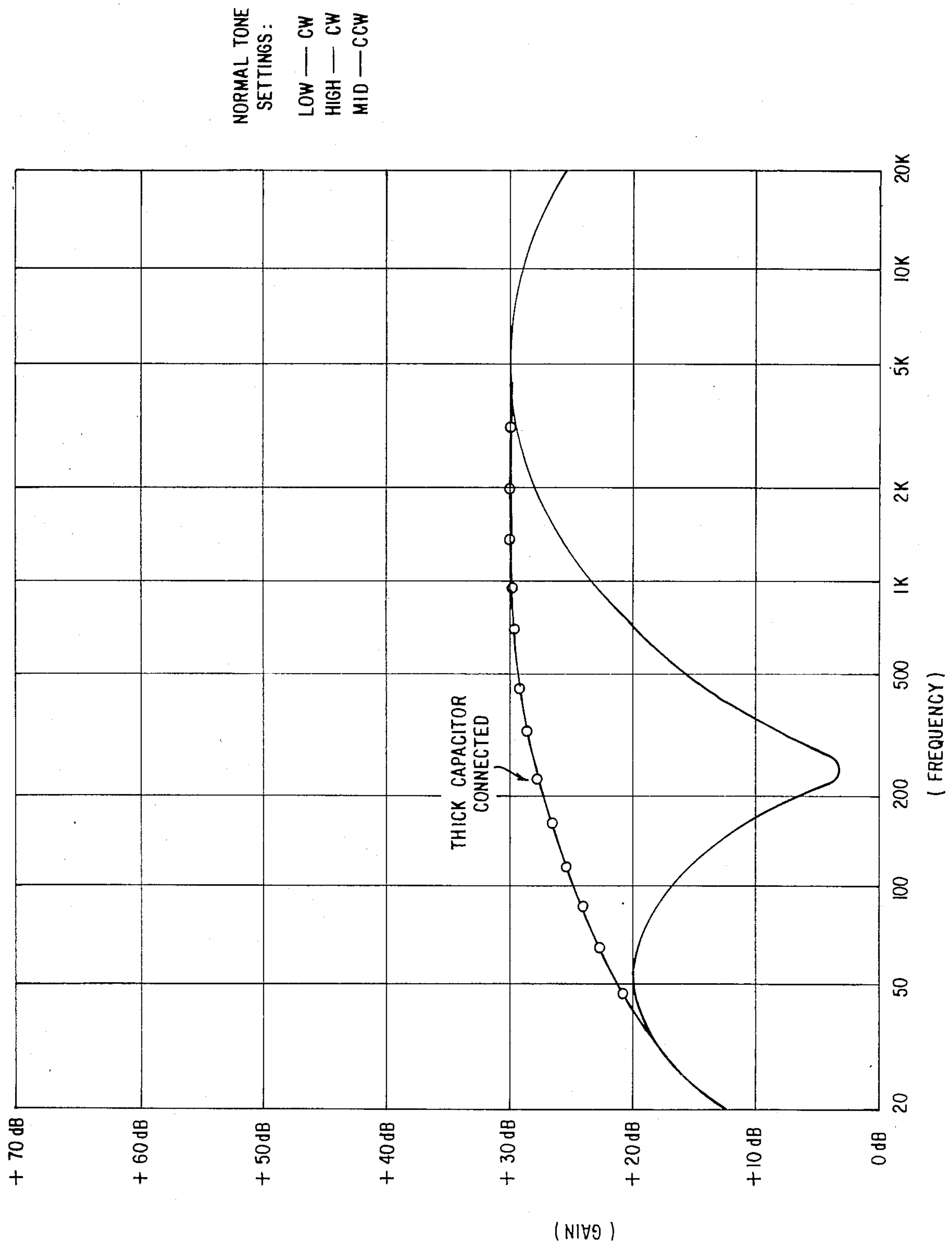
FIG. 2*b* is a gain vs. frequency plot representing the operation of the bridged-T tone control circuit of FIG. 2*a* in both the normal gain control mode and the superdistortion control mode.

FIG. 2*a* shows the pertinent components of the tone control circuit 14 of FIG. 1, and FIG. 2*b* illustrates the gain vs. frequency characteristics of the tone control filter 14 for low, mid-range and high frequencies. With the superdistortion amplifier control circuit of FIG. 1 set in the normal gain mode of operation (ganged switches SW1 and SW2 set oppositely as shown in FIG. 1), capacitor C7 (known as a "thick" capacitor to those skilled in the audio amplifier art) is not connected in parallel with capacitor C8 and therefore the gain vs. frequency response as shown in FIG. 2*b* is the normal tone response as shown in solid lines. However, with ganged switch SW2 set in the superdistortion mode, "thick" capacitor C7 is now electrically connected in tone control filter circuit 14 and the response characteristics thereof are altered as shown by the dotted line in FIG. 2*b*, with a commensurate mid-boost in gain.

From the above description it is evident that the addition of the "thick" capacitor (1) destroys the 250 Hz notch; (2) renders the low and mid-range filters ineffective; and (3) limits or changes the high frequency range control. These characteristics of the frequency response are of particular interest in enhancing the sound output of the superdistortion amplifier circuit of FIG. 1 in the audio frequency range of guitars.

The output of tone control filter stage 14 is electrically connected to the non-inverting input of high gain operational amplifier A2 in superdistortion amplifier stage 16 through interstage coupling capacitor C12. Resistor R12 provides a normal biasing function for operational amplifier A2. Feedback resistor R13 is connected in parallel across feedback capacitor C13. This parallel combination of resistor R13 and capacitor C13 is connected between the output and the inverted input of operational amplifier A2. One terminal of superdistortion gain control potentiometer P5 is connected to the common terminal of resistor R13 and DC isolation capacitor C14. The other terminal of superdistortion gain control potentiometer P5 is connected to the movable tap thereof, which in turn is connected to ground through bleeder resistor R14. Capacitor C15, connected between the respective terminals of resistor R13 and the CW terminal of superdistortion control potentiometer P5, provides DC isolation.

Resistor R15 is serially connected to capacitor C14 and to ground in the superdistortion control mode with SW1 connected as shown in FIG. 1. In the normal gain control mode with switches SW1 and SW2 switched to their respective opposite terminals as shown in FIG. 1, resistor R15 is "floating", the effect of which will be more fully described, infra.

The gain of operational amplifier A2 in superdistortion amplifier stage 16 is determined by the equation:

$$Av=R_{(eff)}/R15+1,$$

where $R_{(eff)}$ is defined as the parallel combination of R13 and P5.

As with the preamplifier stage 12 previously described, it is again convenient for purposes of defining the operational gain characteristics of superdistortion stage 16 to select (1) minimum, (2) maximum and (3) nominal settings of potentiometer P5 (with potentiometer P5 set full CCW defining minimum setting, and set full CW defining maximum setting as shown in FIG. 1, and set at the mid-point for defining the nominal setting).

With the above settings of superdistortion potentiometer P5 the following gains are obtained with the component values as set forth in Table I:

Minimum setting: Gain=1 (0 dB)
Maximum setting: Gain=3200 (approx. +70 dB)
Nominal setting: Gain=830 ( +58 dB)

The inventors consider that approximately 60 dB gain is necessary to achieve the phenomena of "sustain" whereby acoustic feedback is achieved between the guitar and the guitar amplifier/speaker in the audio frequency range normally associated with guitar music.

Thus, movement of the movable tap of superdistortion gain control potentiometer P5 throughout its range of effectiveness (from full CCW to CW rotation), results in a gain change of 1 to 3200, with the superdistortion control amplifier of FIG. 1 set to the superdistortion mode of operation.

The commensurate frequency response of superdistortion stage 16 of FIG. 1 is as follows (using the nominal and maximum potentiometer settings as described, supra):

$$f_{(high)nom}=1/(6.28\times R\times C)=1/(6.28\times 83K\times 270\times 10^{-12})=7\text{ kHz }(-3\text{ dB}).$$

$$f_{(high)max}=1/(6.28R\times C)=1/(6.28\times 320K\times 270\times 10^{-12})=1.8\text{ kHz }(-3\text{ dB}).$$

$$f_{(low)}=1/(6.28\times R\times C)=1/(6.28\times 100\times 2.2\times 10)=700\text{ Hz }(-3\text{ db}).$$

The above computations are made using the component values set forth in Table I.

Figure 3:
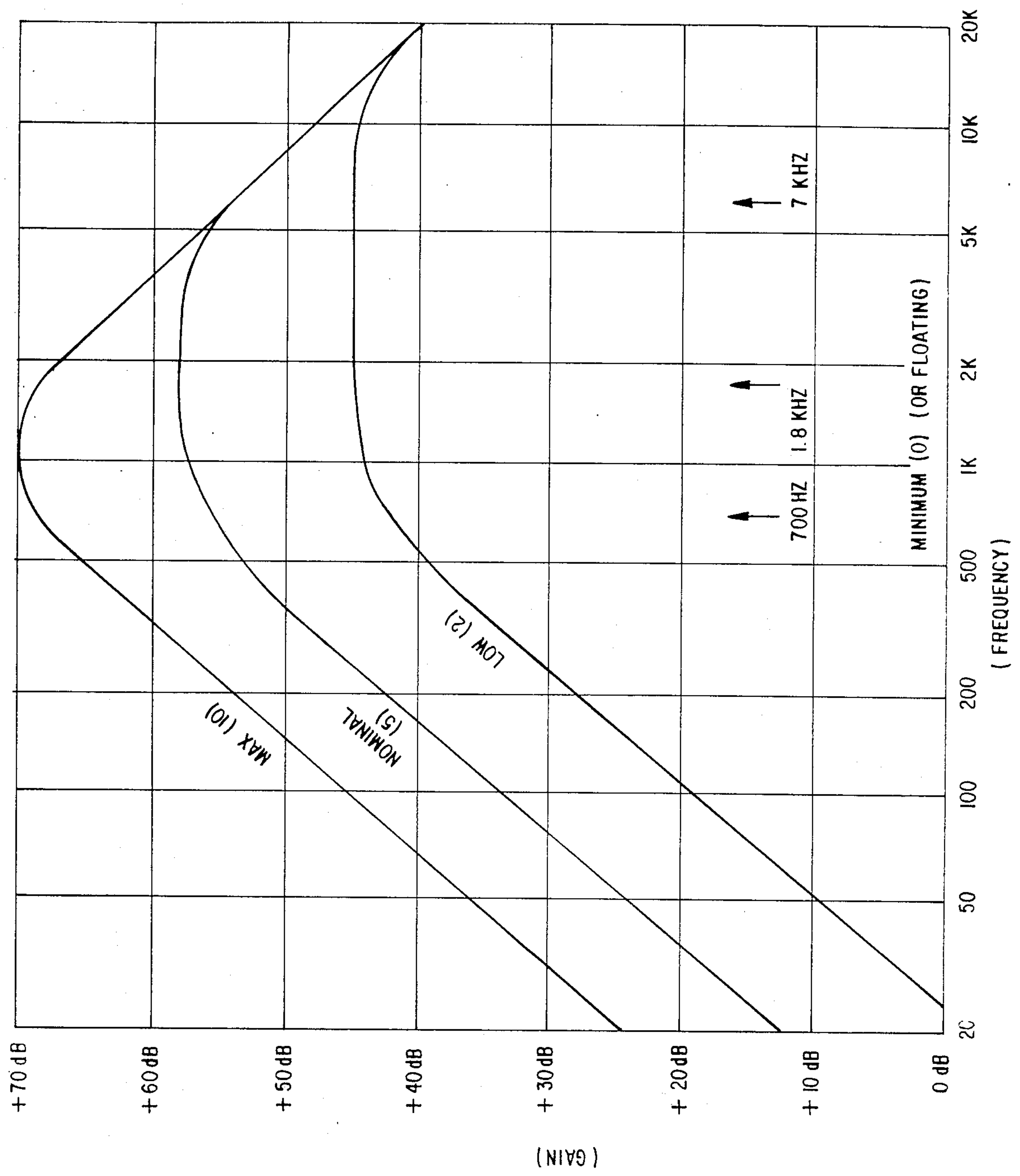
FIG. 3 is a gain vs. frequency plot at specified maximum, nominal and minimum settings of the superdistortion stage of FIG. 1.

FIG. 3 illustrates the gain vs. frequency characteristics of superdistortion stage 16 with the representative component values shown in Table I, for maximum, nominal, low and minimum settings of superdistortion potentiometer P5.

However, in contradistinction to the aforementioned gain and frequency characteristics obtained in the superdistortion mode, the gain is "unity" (0 dB) with the superdistortion control circuit of FIG. 1 set to operate in the normal gain control mode as established by the setting of switches SW1 and SW2 previously described. That is, the gain remains "unity" (0 dB) regardless of the setting of superdistortion potentiometer P5 and there is no alteration of the frequency response of superdistortion amplifier stage 16 in the normal gain mode of operation. This operation is obtained because superdistortion amplifier stage 16 is "floating" and the gain thereof is "unity" (0 dB) regardless of the setting of superdistortion potentiometer P5.

The gain of superdistortion amplifier stage 16 is designed to be high so that the output of operational amplifier A2 in combination with the distortion stage 18*a* is clipped, thereby generating a number of harmonics of the frequencies of the input signals thereto from the output of tone control filter stage 14. The presence of such harmonics is believed by the inventors to enhance the sound output from the amplifier circuitry in the superdistortion control mode, and especially those harmonics associated with the mid-range frequencies. In particular, guitars are known to produce predominantly low frequency notes, and the harmonics generated by the amplification of the superdistortion amplifier stage 16 and distortion stage 18 (described, infra.) are believed to enhance the sound of the output signal generated by the superdistortion amplifier circuitry as shown and described in FIG. 1.

Figure 4:
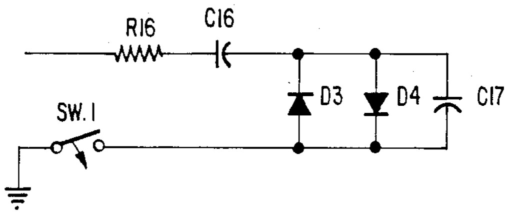
FIG. 4 illustrates the distortion stage of the superdistorted amplifier circuitry of FIG. 1.

With continuing reference to FIG. 1 and additional reference to FIG. 4, the output signal from superdistortion amplifier stage 16 is input through series-connected resistor R16 and capacitor C16 in distortion stage 18*a*, and as shown in the preferred embodiment of FIG. 1, to anti-pole, parallelly-connected clipping diodes D3 and D4. Capacitor C17 is connected in parallel across clipping diodes D3 and D4, to provide high frequency roll-off as discussed more fully, infra.

In the normal gain control mode, superdistortion stage 18*a* is "floating" (as is superdistortion amplifier stage 16), and therefore clipping diodes D3 and D4 are ineffective such that no clipping of the output of superdistortion stage 18 occurs by diodes D3 and D4, and capacitor C17 is not electrically connected so that the frequency response of the output signal from superdistortion stage 16 is not modified by superdistortion clipping stage 18*a*.

In the superdistortion mode of operation, with switch SW1 at contact CT2, superdistortion clipping stage 18*a* is operative such that the amplified audio signal output from superdistortion amplifier stage 16 is clipped at approximately 1.2 volts (peak-to-peak) by diodes D3 and D4. With the component values shown in Table I, including the gain of operational amplifier A2 in superdistortion stage 16, the amplitude of the amplified output signal from superdistortion amplifier stage 16 is approximately 28 volts (peak-to-peak).

Further enhancement of the audio signals, especially in the case where the audio input to the superdistortion amplifier circuit of FIG. 1 is produced by guitars, is provided by the high-frequency roll-off produced by the series-connected resistor R16 and capacitor C17 at a frequency of 5 kHz as determined by the following well-known equation:

$$f=1/(6.28\times R16\times C17)=1/(6.28\times K\times 0.033\times 10^{-6})=5\text{ kHz}$$

As mentioned above, this enhancement of the audio signal takes place only with the superdistortion circuit of FIG. 1 connected in the superdistortion mode of operation. The nominal component values of R16 and C17 are as shown in Table I.

With continuing reference to FIG. 1, coupling capacitor C16 in distortion stage 18*a* provides DC isolation.

Figure 5:
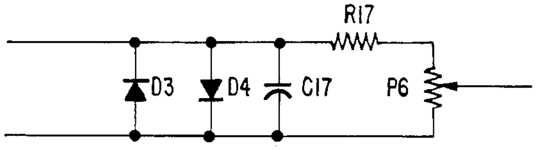
FIG. 5 illustrates the post gain stage of the superdistortion amplifier circuitry of FIG. 1.

The output of the superdistortion amplifier control circuitry shown in FIG. 1 is obtained from the audio signal output of superdistortion clipping stage 18*a* (the audio signal across capacitor C17) and input to post gain stage 18*b* (also shown in detail in FIG. 5). Post gain stage 18*b* consists of resistor R17 connected to capacitor C17 and master volume control potentiometer P6. The maximum gain setting of master volume control potentiometer P6 is at the CW position indicated in FIG. 1, the minimum gain setting of potentiometer P6 is at the opposite, or CCW setting, and the nominal gain setting is with potentiometer P6 set to a mid-position (as are the nominal gain settings of potentiometers P1 and P5, as discussed, supra.). These settings of post gain control potentiometer P6 produce the following gains (with the superdistortion amplifier circuitry of FIG. 1 set to operate in the superdistortion mode):

$A_{max}=\frac{1}{2}$ (−6 dB);

$A_{min}=0$ (−infinity dB); and $A_{nom}=\frac{1}{4}$ (−12 dB)

In the normal gain control mode of operation of the superdistortion amplifier control circuitry of FIG. 1, the post gain control stage 18*b* is "floating" and therefore the gain of that stage is "unity" (0 db) regardless of the setting of master volume control potentiometer P6 (in conjunction with the unity gain operation of superdistortion clipping circuit 18*a* and superdistortion amplifier stage 16, as described, supra.)

It is evident to those skilled in the audio amplifier art that the aforementioned operation of post gain control stage 18*b* affords additional flexibility in controlling the amplification of audio signals in that the gain of post gain control stage 18*b* is effective only in the superdistortion control mode of operation and ineffective in the normal gain mode.

The output from post gain control potentiometer P6 is input to a power amplifier (not shown) to provide the audio output.

In the modified embodiment of the superdistortion control amplifier circuit shown in FIG. 6, the preamplifier stage 12, tone control filter stage 14, superdistortion amplifier stage 16, distortion stage 18*a* and post gain control stage 18*b* are identical to that of FIG. 1. However, the superdistortion control amplifier of FIG. 6 has been modified to include the following: (1) a dual high/low gain input circuit; (2) an intermediate amplifier stage 24; (3) a "presence" circuit 26 connected to the output from post distortion gain potentiometer P5; and (4) an external footswitch circuit 28, which is substituted for the push switches SW1 and SW2.

Dual high/low gain input circuit 10′ (consisting of input jacks J21 and J22 and resistors R20 and R21) reduces the gain of an input signal by ½ (with resistors R20 and R21 of equal value) when the audio input signal is connected with the low gain portion of the input jack. This feature is desirable for high level audio input signals to avoid saturation of operational amplifier A1 in preamplifier stage 12.

Continuing with the circuitry shown in FIG. 6, intermediate amplifier stage 24 connected between the output of preamplifier stage 12 and the input of the tone control filter stage 14 provides amplification of the output of preamplifier stage 12. The output of preamplifier stage 12, obtained from the normal gain potentiometer P1, is input through capacitor C20 to the non-inverting input of operational amplifier A3. Resistor R18 provides normal biasing of operational amplifier A3. A feedback network consisting of parallelly-connected resistor R22 and C21 is connected between the output and inverting input of the operational amplifier as shown in FIG. 6. Capacitor C22 is connected to the common node of resistor R22 and capacitor C21, and capacitor C22 is serially connected to the common node of the movable tap of normal gain potentiometer P1 and switch SW1 of the relay through resistor R19. The gain Av of intermediate amplifier stage 24 is determined as:

$$Av=1+R22/R19=4.3$$

with the component values as indicated in Table I.

This gain is obtained only in the normal gain control mode of operation (ganged mode control switches SW1 and SW2 set as shown in FIG. 6). In the superdistortion control mode of operation, with the ganged switches SW1 and SW2 set opposite to that illustrated in FIG. 6, intermediate amplifier stage 24 is "floating" and has a gain of "unity" (0 dB). This independent operation of intermediate amplifier stage 24 provides flexibility in controlling the gain of the audio frequency signals input to the superdistortion amplifier control circuitry of FIG. 6, consistent with the operation of the superdistortion control circuitry previously described with respect to FIG. 1.

The modified superdistorted audio amplifier circuit of FIG. 6 shows "presence" amplifier circuit 26 connected to the output of the superdistorted audio amplifier circuit of FIG. 1, namely the output of post distortion gain control potentiometer P6. Presence circuit 26 is known to the art and is illustrated in FIG. 6 to demonstrate the use of "peripheral" circuitry with the superdistorted audio amplifier control circuitry of the present invention, and therefore no further description of its structure and operation is necessary for the purposes of this invention.

FIG. 6 illustrates an external footswitch circuit 28 adapted to be used with the superdistortion audio amplifier control circuitry of the present invention in a manner similar to that of DPDT switches SW1 and SW2 of FIG. 1. Additionally, footswitch circuit 28 also includes diode D5 and parallelly-connected capacitor C19, which in turn are parallelly connected across the coil L1 of the DPDT relay associated with footswitch circuit 28. Diode D5 and capacitor C19 prevent "flyback" and "ringing" upon activation and deactivation of superdistortion mode control switch 28 by depression of a remote shorting switch connected to footswitch jack J23, as is known to those skilled in the audio amplifier art.

Table I lists the various components and their respective associated exemplary component values of the embodiments of the superdistorted audio ampifier control circuit described herein.

The preceding specification describes exemplary preferred embodiments of the best mode of carrying out the invention, and is therefore not intended to represent limitations of the scope of the invention. It is understood that equivalent variations and modifications of the invention will be apparent to those skilled in the audio amplification art. For example, the distortion stage 18*a* could consist of multiple series/parallel-connected diodes (germanium or silicon), zener diodes, or other clipping means. Also, the switches SW1 and SW2 in FIG. 1 could consist of two individual switches instead of ganged switches. Such variations, modifications and equivalents are within the scope of the invention as set forth in the claims appended hereto, with such claims interpreted to obtain benefit of all of the equivalents to which the invention is entitled.

TABLE I

| COMPONENT | VALUE | COMPONENT | VALUE |
|---|---|---|---|
| Resistors | | Capacitors | |
| R1 | 1 kohm | C1 | 100 pF |
| R2 | 220 kohms | C2 | .1 uF |
| R3 | 33 kohms | C3 | .1 uF |
| R4 | 3.3 kohms | C3 | .1 uF |
| R5 | 22 kohms | C4 | 100 pF |
| R6 | 2.7 kohms | C5 | 2.2 uF |
| R7 | 470 ohms | C6 | .033 uF |
| R8 | 47 kohms | C7 | .015 uF |
| R10 | 10 kohms | C8 | 270 pF |
| R11 | 220 kohms | C9 | .047 uF |
| R12 | 470 kohms | C10 | .1 uF |
| R13 | 470 kohms | C11 | .015 uF |
| R14 | 22 kohms | C12 | .1 uF |
| R15 | 100 ohms | C13 | 270 pF |
| R16 | 1 kohm | C14 | 2.2 uF |
| R17 | 10 kohms | C15 | 2.2 uF |
| R18 | 47 kohms | C16 | 2.2 uF |
| R19 | 10 kohms | C17 | .033 uF |
| R20 | 22 kohms | C18 | 2.2 uF |
| R21 | 22 kohms | C19 | 2.2 uF |
| R22 | 33 kohms | C20 | .1 uF |
| | | C21 | 100 pF |
| | | C22 | 2.2 uF |
| Potentiometers | | | |
| P1 | 10 K (linear) | | |
| P2 | 250 K (linear) | | |
| P3 | 50 K (linear) | | |
| P4 | 250 K (audio) | | |
| P5 | 1 M (audio) | | |
| P6 | 10 K (linear) | | |

What is claimed is:

1. Circuitry for amplifying audio signals, comprising:

preamplifier means for amplifying the audio signals and including a first operational amplifier for receiving the audio signals at a non-inverting input thereof and providing a first amplified signal output, first feedback means interconnected between the output of said operational amplifier and an inverting input thereof for variably controlling the gain and frequency response of said operational amplifier within a predetermined range of audio frequencies;

amplifier means responsive to said first amplified signal output and including a second operational amplifier for providing a second amplified signal output and including a second feedback means for selectively controlling the gain and frequency response of said second operational amplifier within a second predetermined range of audio frequencies;

distortion means for selectively distorting said second amplified signal output to provide at least one of a distorted audio output signal and a non-distorted audio output signal;

post gain control means for independently amplifying said distorted audio output signal to provide a third amplified signal output; and switching means for selectively controlling said preamplifier means, amplifier means and said distortion means to provide said distorted audio output signal with said switching means at one position, and said non-distorted audio output signal with said switching means at another position.

2. Circuitry according to claim 1 wherein said first feedback means includes first circuit means for varying the gain of said first operational amplifier.

3. Circuitry according to claim 2 wherein said first circuit means includes a variable potentiometer electrically connected to said switching means.

4. Circuitry according to claim 1 further comprising tone control filter means for filtering said first amplified signal output in at least one of several frequency ranges to provide a filtered output signal; and wherein said switching means includes first and second switching sections each having respective one and another operating positions with said second switching section being electrically connected in said tone control filter means with said switching means set to said one position, said second switching section modifies said filtered output signal with said switching means set to said another position, and said second switching section does not modify said filtered output signal with said switching means set to said one position.

5. Circuitry according to claim 4 wherein said first and second switching sections are ganged.

6. Circuitry according to claim 4 wherein said tone control filter means further includes at least first, second and third filter sections respectively operating in different frequency ranges of said audio signals, and a second potentiometer electrically connected in one of said at least first, second and third filter sections for selectively varying the gain of said filtered output signal.

7. Circuitry according to claim 4 wherein said first and second switching sections are ganged.

8. Circuitry according to claim 4 wherein said switching means is an external footswitch for operating said first and second switching sections.

9. Circuitry according to claim 4 further comprising intermediate amplifier means responsive to first amplified signal output and providing an intermediate amplified signal output to said tone control filter means.

10. Circuitry according to claim 2 wherein, with said switching means at said one position, said first circuit means is electrically disconnected from said first operational amplifier, and said amplifier means, distortion means and post gain control means are enabled to provide said distorted audio output signal.

11. Circuitry according to claim 10 wherein said second feedback means includes second circuit means for varying the gain and frequency response of said second operational amplifier at respective predetermined low and high frequencies to vary said second amplified signal output.

12. Circuitry according to claim 11 wherein said second circuit means is a selectively variable potentiometer for providing a broad range of selective gain control of said second amplified signal output.

13. Circuitry according to claim 11 further comprising tone control filter means for providing a filtered audio output signal and including second switching means operable with said switching means such that with said switching means at said one position, said filtered audio output signal is not affected.

14. Circuitry according to claim 13 said tone control filter means further includes at least first, second and third filter sections respectively operating in different frequency ranges of said audio signals, and at least one of said first, second and third filter sections includes a "thick" capacitor connected to said second switching means such that with said first switching means at said one position said "thick" capacitor is connected in one of said first, second and third filter sections, and with said first switching means at said another position said "thick" capacitor is not connected in one of said first, second and third filter sections.

15. Circuitry according to claim 14 wherein said tone control filter means includes passive filter circuitry.

16. Circuitry according to claim 1 wherein said distortion means includes clipping means responsive to said second signal output for providing said distorted audio output signal.

17. Circuitry according to claim 16 wherein said clipping means is operable when said switching means is at said one position.

18. Circuitry according to claim 1 wherein said switching means is a DPDT push button switch.

19. Circuitry according to claim 1 wherein said switching means is an external footswitch.

20. Circuitry according to claim 1 further comprising input jack means connected to the non-inverting input of said first operational amplifier for receiving an audio input signal and including means for providing at least one reduced amplified signal level output.

21. Circuitry according to claim 1 wherein said post gain control means is a variable potentiometer.

22. Circuitry according to claim 21 wherein said post gain control means is operable with said switching means at said one position.

23. Circuitry for selectively amplifying audio signals in distorted and non-distorted modes, comprising:

a series connection of variable gain first amplifier means, variable gain second amplifier means and clipping means; and switching means for selectively controlling the first amplifier means, the second amplifier means and the clipping means so that the second amplifier means provides substantially unity gain irrespective of any gain to which it is adjusted while the first amplifier means provides that gain to which it is adjusted and the clipping means is disabled in one position of the switching means to produce a non-distorted audio signal output, and in another position of the switching means first amplifier means has unity gain, the second amplifier means has variable gain, and the clipping means is enabled to produce a distorted audio signal output.

24. Circuitry as defined in claim 23 tone control filter means connected between the first amplifier means and the second amplifier means for filtering low- mid- and high-range frequencies at the one position of the switching means and for emphasizing frequencies between the low- and high-range frequencies at the another position of the switching means.

25. Circuitry as defined in claim 24 including post gain control means for selectively controlling gain of the circuitry at said another position of the switching means and which is disabled at the one position of the switching means.

26. Circuitry as defined in claim 25 wherein the gain of the post gain control means is variable between about 0 dB and −12 dB.

27. Circuitry for selectively amplifying audio signals in distorted and non-distorted modes, comprising:

low gain amplifier means having an input for receiving the audio signals and an output for providing a first amplified signal output;

first feedback means interconnected between the output and input of the low gain amplifier means for selectively controlling the gain and frequency response of the low gain amplifier means within a predetermined range of audio frequencies;

high gain amplifier means having an input in series connection with the first amplified output signal and an output for providing a second amplified output signal;

second feedback means interconnected between the output and the input of the high gain amplifier means for selectively controlling the gain and frequency response of the high gain amplifier means within a second predetermined range of audio frequencies;

distortion means having an input connected to the output of the high gain amplifier means for providing a distorted audio output signal when the high gain amplifier means is adjusted through its feedback means to provide a second amplified output signal of high gain; and switching means for selectively controlling the low gain amplifier means, the high gain amplifier means and the distortion means so that the high gain amplifier means provides substantially unity gain irrespective of any setting of its feedback means while the low gain amplifier means provides that gain to which its feedback means is set and the distortion means is disabled in one position of the switching means, and in another position of the switching means the low gain amplifier means has unity gain, the high gain amplifier means has variable gain, and the distortion means is enabled.

28. Circuitry as defined in claim 27 including tone control filter means between the low gain amplifier means and the high gain amplifier means for filtering low- mid- and high-range frequencies at the one position of the switching means and for emphasizing frequencies between the low- and high-range frequencies at the another position of the switching means.

29. Circuitry for selectively amplifying audio signals in distorted and non-distorted modes, comprising:

a series connection of variable gain first amplifier means, tone control means, variable gain second amplifier means and clipping means; and switching means for selectively controlling the first amplifier means, the second amplifier means and the clipping means so that the second amplifier means provides substantially unity gain irrespective of any setting of its variable gain while the first amplifier means provides that gain to which it is adjusted, the tone control means gives a non-distortion frequency response and the clipping means is disabled in one position of the switching means to produce a non-distorted audio signal output, and in another position of the switching means, the first amplifier means has unity gain, the second amplifier means has variable gain, the tone control means has a distortion frequency response, and the clipping means is enabled to produce a distorted audio signal output.

30. Circuitry as defined in claim 29 the tone control means for filtering low- mid- and high-range frequencies at the one position of the switching means and for emphasizing frequencies between the low- and high-range frequencies at the another position of the switching means.

31. Circuitry as defined in claim 30 wherein the tone control means includes a "thick" capacitor switched into circuit at the another position of the switching means and switched out of circuit at the one position of the switching means.

32. Circuitry for amplifying audio signals, comprising:

first amplifier means having an input for receiving the audio signals and an output for providing a first amplified signal output, first feedback means interconnected between the output and input of the first amplifier means for selectively controlling the gain and frequency response of said first amplifier means within a predetermined range of audio frequencies;

second amplifier means serially connected with the first amplifier means having an input responsive to the first amplified output signal and an output for providing a second amplified output signal and including a second feedback means for selectively controlling the gain and frequency response of said second amplifier means within a second predetermined range of audio frequencies;

distortion means for selectively distorting said second amplified signal output to provide at least one of a distorted audio output signal and a non-distorted audio output signal dependent upon unity gain and non-unity gain of the preamplifier means;

post gain control means for independently amplifying the output of the distortion means; and switching means for selectively controlling said preamplifier means so that it is "floating" with unity gain in one position of the switching means and has a non-unity, low gain as set by the first feedback means at another position of the switching means, for selectively controlling the amplifier means so that it is "floating" with unity gain in the another position of the switching means and has a non-unity, high gain as set by the second feedback means when the switching means is in the one position thereof, so that said distortion means provides said distorted audio output signal with said switching means at the one position, and said non-distorted audio output signal with said switching means at the another position.

33. Circuitry as defined in claim 32 including tone control filter means for filtering said first amplified output signal in high, mid and low frequency ranges and including a "thick" capacitor altering high, mid and low range filtering, the switching means connecting and disconnecting the "thick" capacitor in circuit in response to the one and another positions of the switching means respectively.

34. Circuitry for selectively amplifying audio signals in superdistorted and clean, non-distorted audio output modes, comprising:

a series connection of variable gain first amplifier means for producing the clean, non-distorted audio output mode from the circuitry, tone control filter means for selectively providing frequency filtering of a first kind and of a second kind, variable gain superdistortion amplifier means for providing a high gain output, clipping means for clipping the high gain output to provide the superdistorted audio output mode from the circuitry, and post gain control means for selectively varying the gain of the superdistorted audio output mode; and switching means for selectively controlling the first amplifier means, the superdistortion amplifier means, the clipping means and the post gain control means so that the superdistortion amplifier means provides substantially unity gain irrespective of any setting of its variable gain while the first amplifier means provides that gain to which it is adjusted, the tone control filter means is adjusted to frequency filtering of the first kind and the clipping means and post gain control means are disabled at one position of the switching means to produce the clean, non-distorted audio output mode from the circuitry, and the first amplifier means provides substantially unity gain irrespective of any setting of its variable gain while the superdistortion amplifier means provides that gain to which it is adjusted, the tone control filter means is adjusted to frequency filtering of the second kind, and the clipping means and the post gain control means are enabled at another position of the switching means to produce the superdistorted audio output mode from the circuitry.

35. Circuitry as defined in claim 34 wherein the frequency filtering of the first kind comprises low- mid- and high-range frequency filtering with a notch at a predetermined low frequency and the frequency filtering of the second kind comprises low- to high-range frequency filtering which eliminates the notch.

36. Circuitry as defined in claim 35 wherein the gain of the post gain control means is variable between about 0 dB and −12 dB.

37. Circuitry as defined in claim 34 wherein the first amplifier means is variable in gain up to about 35 dB and the superdistortion amplifier means is variable in gain up to about 70 dB.

38. Circuitry as defined in claim 35 wherein the first amplifier means is variable in gain up to about 35 dB and the superdistortion amplifier means is variable in gain up to about 70 dB.

39. Circuitry as defined in claim 36 wherein the first amplifier means is variable in gain up to about 35 dB and the superdistortion amplifier means is variable in gain up to about 70 dB.

* * * * *